US009580300B2

(12) United States Patent
Meyer

(10) Patent No.: US 9,580,300 B2
(45) Date of Patent: Feb. 28, 2017

(54) SYSTEMS AND METHODS FOR NUCLEAR EVENT CIRCUMVENTION IN AN INERTIAL DEVICE

(75) Inventor: Robert Meyer, Kirkland, WA (US)

(73) Assignee: Honeywell International Inc., Morris Plains, NJ (US)

( * ) Notice: Subject to any disclaimer, the term of this patent is extended or adjusted under 35 U.S.C. 154(b) by 2473 days.

(21) Appl. No.: 12/027,854

(22) Filed: Feb. 7, 2008

(65) Prior Publication Data
US 2016/0377645 A1 Dec. 29, 2016

(51) Int. Cl.
*G01C 19/5733* (2012.01)
*B81B 7/00* (2006.01)

(52) U.S. Cl.
CPC .................... *B81B 7/0019* (2013.01)

(58) Field of Classification Search
USPC ................. 73/514.01, 497; 250/370.15
See application file for complete search history.

(56) References Cited

U.S. PATENT DOCUMENTS

| | | | | |
|---|---|---|---|---|
| 5,969,250 A * | 10/1999 | Greiff | ................ | 73/514.38 |
| 6,453,744 B2 * | 9/2002 | Williams | ................ | 73/504.12 |
| 6,487,864 B1 * | 12/2002 | Platt et al. | ................ | 62/3.2 |
| 2007/0158575 A1 * | 7/2007 | Heismann et al. | ...... | 250/370.15 |

* cited by examiner

*Primary Examiner* — Sean P Burke
(74) *Attorney, Agent, or Firm* — Shumaker & Sieffert, P.A.

(57) ABSTRACT

Systems and methods with the ability to raise the set point temperature immediately after a temperature increase due to radiation exposure, thereby reducing T-dot (rate of change in temperature) errors when trying to cool the inertial system back to its original set point temperature. An example system includes an inertial instrument, a sensor that senses if an increased temperature event has been experienced by the inertial instrument, and a controller device that will increase the set point temperature of the inertial instrument based on the determined increase in temperature. The controller device will also maintain the inertial instrument at a temperature associated with at least one of the sensed increased temperature event or the increased set point temperature.

19 Claims, 3 Drawing Sheets

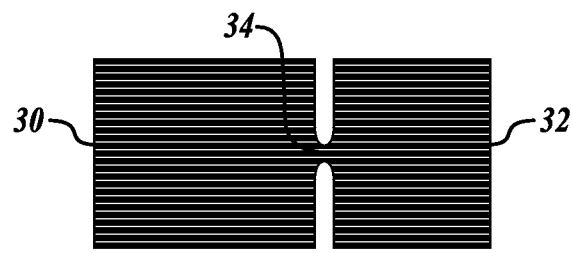
*FIG. 2-1* *(PRIOR ART)*
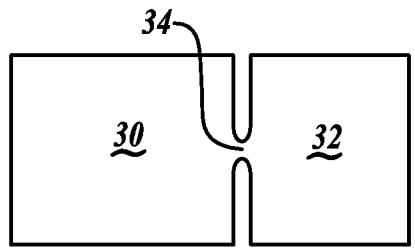
*FIG. 2-2* *(PRIOR ART)*
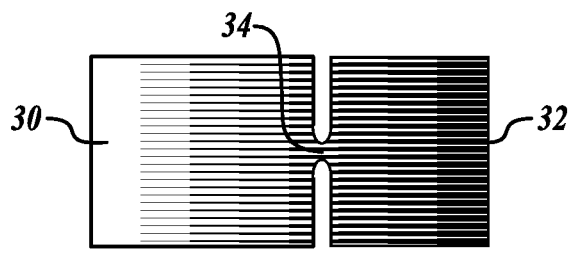
*FIG. 2-3* *(PRIOR ART)*
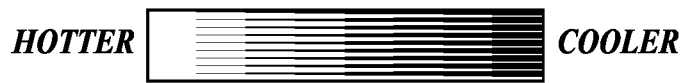
*FIG. 2-4* *(PRIOR ART)*

SYSTEMS AND METHODS FOR NUCLEAR EVENT CIRCUMVENTION IN AN INERTIAL DEVICE

GOVERNMENT INTEREST

This invention was made with government support under Contract No. FA9453-05-C-0241 awarded by Air Force Research Labs. The Government has certain rights in the invention.

BACKGROUND OF THE INVENTION

Gamma radiation exposures from nuclear weapons raises the temperature of inertial instruments. Certain kinds of inertial instruments, most notably Vibrating Beam Accelerometers (VBAs), exhibit measurement errors due to not just this change in temperature, but also the rate of change of temperature (T-dot).

High accuracy inertial instruments are temperature controlled to eliminate errors due to temperature drift. In many kinds of instruments T-dot induces greater errors than does the absolute temperature change. Since it is impossible to prevent an initial sudden rate of temperature change due to pulsed gamma ray exposure, the usual approach is to try, when possible, to rapidly return the instrument to its set point temperature. However, the rate of change of temperature while returning the unit to the set point may induce errors greater than those resulting from the absolute change of temperature.

As shown in FIG. 2-1, consider a typical VBA 24 with a proof mass 30 attached to a mechanically stable member 32 by some kind of elastic hinge 34. Heating due to radiation is quite different. Radiation causes consistent heating throughout the proof mass 30 and stable member 32. Since the proof mass and stable member are usually made from the same material, the temperature increase throughout the two masses will be very nearly equal with the major difference being due to unequal exposures of the two masses. The small gradients would produce small strains with a consequently small error. When the unit is thermally stabilized (post thermal increase event) there are no temperature gradients across the hinge 34 (FIG. 2-2). When the temperature controller attempts to lower the temperature of the instrument, initially, heat will begin to flow out of the stable member 32 and a temperature gradient will form across the length of the device (x axis). Then, after some delay, heat will begin to flow through the hinge 34 creating a significant gradient. This gradient will continue to exist while the heat is removed from the proof mass 30 (see FIG. 2-3). Since the hinge 34 has a relatively small cross-sectional area, the process can take quite a while. During this time, the thermal gradients across the hinge 34 will result in a change in the strains within the hinge 34 and thereby inducing errors into the movement of the proof mass 30.

SUMMARY OF THE INVENTION

The present invention provides an inertial system with the ability to raise the set point temperature immediately after a temperature increase due to radiation exposure, thereby reducing T-dot (rate of change in temperature) errors when trying to cool the inertial system back to its original set point temperature.

In one example embodiment, the system includes an inertial instrument, a sensor that senses if an increased temperature event has been experienced by the inertial instrument, and a controller device that will increase the set point temperature of the inertial instrument based on the determined increase in temperature. The controller device will also maintain the inertial instrument at a temperature associated with at least one of the sensed increased temperature event or the increased set point temperature.

In one aspect of the invention, the inertial instrument includes one or more vibrating beam accelerometers. One of the one or more vibrating beam accelerometers includes a proof mass, a stable member and at least one hinge configured to flexibly attach the proof mass to the stable member within a housing.

In another aspect of the invention, the sensor comprises one or more temperature sensors and/or radiation sensors. The temperature associated with at least one of the sensed increased temperature event or the increased set point temperature is based on a radiation value from the radiation sensor.

In still another aspect of the invention, the system includes a device that determines acceleration values based on signals produced by the one or more vibrating beam accelerometers and the increased set point temperature.

In yet another aspect of the invention, the controller device includes a heating device that applies heat to at least one of a cavity within the housing or the stable member.

In still yet another aspect of the invention, the controller device maintains the inertial instrument at the temperature associated with at least one of the sensed increased temperature event or the increased set point temperature after effects of the increased temperature event are no longer experienced.

BRIEF DESCRIPTION OF THE DRAWINGS

FIGS. 2-1 through 2-3 illustrate top views of heating and cooling characteristics for vibrating beam accelerometer during and after a nuclear event has occurred (FIGS. 2-4 is a legend illustrating the relative temperature represented by the shading in FIGS. 2-1 through 2-3); and FIG. 3 illustrates a flow diagram illustrating a sample process performed by the system from FIG. 1.

DETAILED DESCRIPTION OF THE PREFERRED EMBODIMENT

Figure 1:
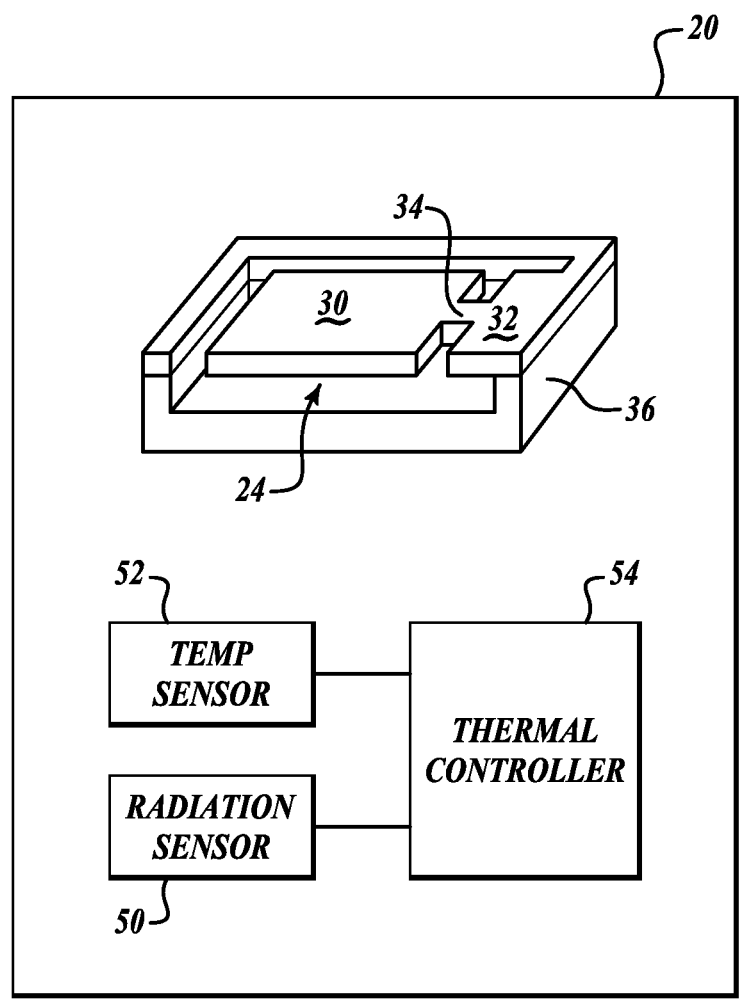
FIG. 1 illustrates a schematic diagram of an inertial system formed in accordance with an embodiment of the present invention.

FIG. 1 illustrates an example inertial system 20 formed in accordance with the embodiment of the present invention. In this embodiment, the inertial system 20 includes a vibrating beam accelerometer (VBA) 24, a thermal controller/processor 54, and one or both of a temperature sensor 52, or a radiation sensor 50.

The VBA 24 is shown in a cut-away view with the cover removed. The VBA 24 includes a proof mass 30 connected to a stable member 32 via a hinge mechanism 34. The proof mass 30, hinge 34, and stable member 32 are all formed of a monolithic material in a mechanism layer (e.g., selectively doped Silicon, quartz, elgiloy, or any other comparable material). The parts may also be non-monlithic. The stable member 32 is held in a stable position within a housing 36 with the proof mass 30 being able to move in response to a sensed force within a cavity formed by the housing 36.

The temperature sensor 52 is located either inside the housing 36, in proximity to the housing 36, or in a location with the ability to be thermally connected with the proof mass 30, hinge 34, and stable member 32. In another embodiment, the radiation sensor 50 is located proximate to the housing 36 or within the housing 36. The thermal controller/processor 54 is in data communication with the temperature sensor 52 and radiation sensor 50. The thermal controller/processor 54 includes at least a heating unit that has the ability to control temperature experienced by the VBA 24.

The thermal controller/processor 54 also receives signals from the VBA 24 for outputting acceleration signals based on the received signals from the VBA 24. The thermal controller/processor 54 will raise the set point temperature of the VBA 24 for analysis of signals received from the VBA 24 if an increased temperature is sensed by the temperature sensor 52 or a radiation event was sensed based on a signal sent by the radiation sensor 50. Also, the thermal controller/processor 54 will increase the temperature sensed by the VBA 24 so that when a determined radiation event ceases to exist, the temperature of the device 24 is maintained at the radiation-induced temperature so that the VBA 24 can operate relative to the new increased set point temperature.

Figure 3:
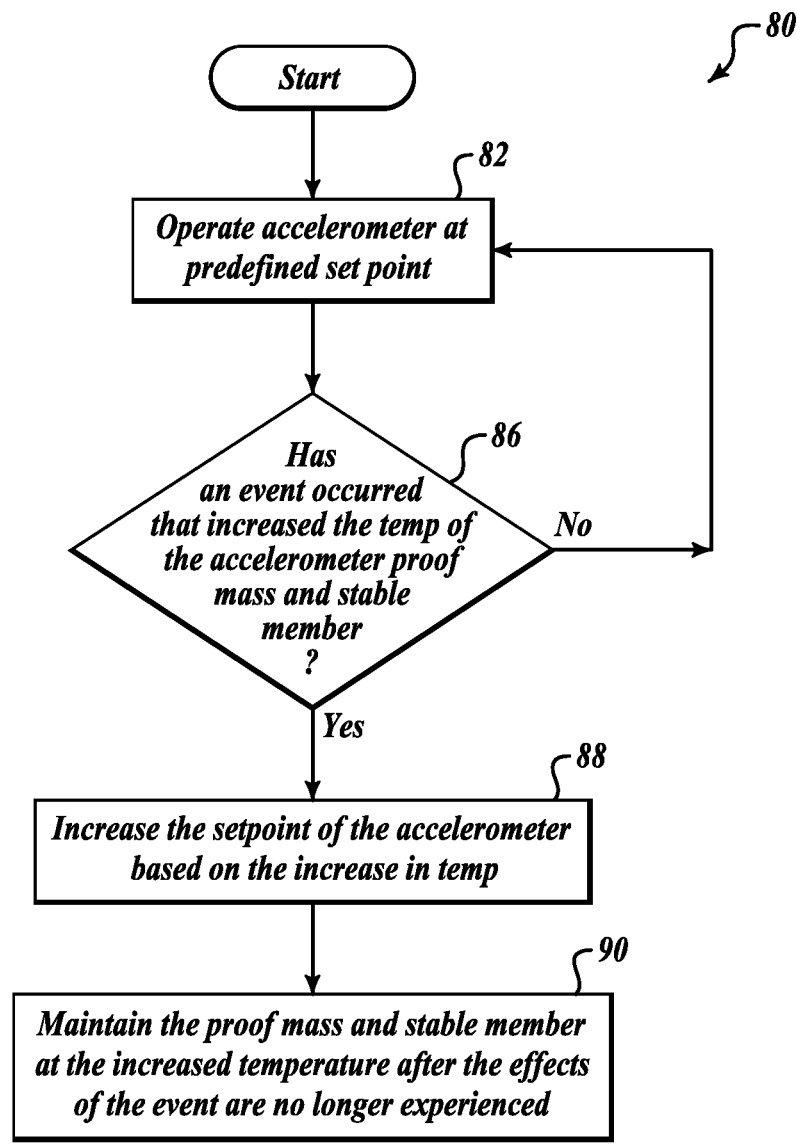

As shown in FIG. 3, an example process 80 is performed by the system 20 shown in FIG. 1. First at block 82, the system 20 operates at a predefined set point. At a decision block 86, the thermal controller/processor 54 determines if a radiation event has occurred that increases the temperature of the components of the VBA 24. If no radiation event is determined to have occurred, then the process returns to block 82. An increased temperature event is determined to have occurred based on temperature information from the temperature sensor 52 or information received by the radiation sensor 50. The thermal controller/processor 54 increases the set point of the VBA 24 based on determination of an increased temperature event, see block 88. Next, at block 90, the thermal controller/processor 54 maintains the VBA 24 at, or within, a threshold limit of the sensed temperature or a temperature value associated with the radiation sensor information. The VBA 24 is maintained at the increased temperature (associated with the increased set point) even after the effects of the increased temperature event are no longer experienced. The system 20 continues to operate in this manner until the system 20 is de-activated or an operational state allows the system to be cooled, thus returning operation to the original setpoint.

Because the thermal controller/processor 54 raises the set point temperature and the temperature of the VBA 24 is maintained at the higher temperature, the heat flow patterns will not change as much as they would if the VBA 24 was cooled back down to its original set point temperature. Thus, consequently errors due to temperature gradients and T-dot will be reduced.

While the preferred embodiment of the invention has been illustrated and described, as noted above, many changes can be made without departing from the spirit and scope of the invention. For example, any number or combination of temperature and radiation sensors may be used. Also, the thermal controller/processor 54 may be separate units—one to control heating of the VBA and one to process signals produced by the VBA. Accordingly, the scope of the invention is not limited by the disclosure of the preferred embodiment. Instead, the invention should be determined entirely by reference to the claims that follow.

The embodiments of the invention in which an exclusive property or privilege is claimed as defined as follows:

1. An inertial system having a set point temperature, the system comprising:
    an inertial instrument;
    a sensor configured to sense if an increased temperature event has been experienced by the inertial instrument; and
    a controller device configured to increase the set point temperature of the inertial instrument in response to sensing of the increased temperature event sensed by the sensor, wherein the controller device is configured to maintain the inertial instrument at a temperature associated with at least one of the sensed increased temperature event or the increased set point temperature.

2. The system of claim 1, wherein the inertial instrument comprises one or more vibrating beam accelerometers, and wherein one of the one or more vibrating beam accelerometers comprises a proof mass, a stable member and at least one hinge configured to flexibly attach the proof mass to the stable member within a housing.

3. The system of claim 2, wherein the sensor comprises one or more temperature sensors.

4. The system of claim 2, wherein the sensor comprises one or more radiation sensors configured to produce a radiation value.

5. The system of claim 4, wherein the temperature associated with at least one of the sensed increased temperature event or the increased set point temperature is based on the radiation value.

6. The system of claim 5, wherein the radiation value includes gamma radiation levels.

7. The system of claim 2, further comprising:
    a device configured to determine acceleration values based on signals produced by the one or more vibrating beam accelerometers and the increased set point temperature.

8. The system of claim 2, wherein the controller device comprises a heating device configured to apply heat to at least one of a cavity within the housing or the stable member.

9. The system of claim 8, wherein the controller device maintains the inertial instrument at the temperature associated with at least one of the sensed increased temperature event or the increased set point temperature after effects of the increased temperature event are no longer experienced.

10. The system of claim 1, wherein the inertial system comprises one or more gyros or other inertial instruments that experience a temperature rate of change effect.

11. An inertial system having a set point temperature, the system comprising:
    means for sensing an acceleration;
    means for sensing if an increased temperature event has been experienced by an inertial instrument; and
    means for increasing the set point temperature of the inertial instrument in response to sensing of the increased temperature event sensed by the means for sensing and maintaining the inertial instrument at a temperature associated with at least one of the sensed increased temperature event or the increased set point temperature.

12. The system of claim 11, wherein the means for sensing the acceleration comprises one or more vibrating beam accelerometers, and wherein one of the one or more vibrating beam accelerometers comprises a proof mass, a stable member and at least one hinge configured to flexibly attach the proof mass to the stable member within a housing.

13. The system of claim 12, wherein the means for sensing the temperature event comprises one or more temperature sensors.

14. The system of claim 12, wherein the means for sensing the temperature event comprises one or more radiation sensors configured to produce a radiation value.

15. The system of claim 14, wherein the temperature associated with at least one of the sensed increased temperature event or the increased set point temperature is based on the radiation value.

16. The system of claim 15, wherein the radiation value includes gamma radiation levels.

17. The system of claim 12, further comprising:
means for determining acceleration values based on signals produced by the one or more vibrating beam accelerometers and the increased set point temperature.

18. The system of claim 12, wherein the means for increasing the set point temperature comprises a heating device configured to apply heat to at least one of a cavity within the housing or the stable member.

19. The system of claim 18, wherein the means for increasing the set point temperature further maintains the inertial instrument at the temperature associated with at least one of the sensed increased temperature event or the increased set point temperature after effects of the increased temperature event are no longer experienced.

* * * * *